(12) United States Patent
Ware et al.

(10) Patent No.: US 9,847,248 B2
(45) Date of Patent: Dec. 19, 2017

(54) METHOD OF MAKING A STACKED DEVICE ASSEMBLY

(71) Applicant: Rambus Inc., Sunnyvale, CA (US)

(72) Inventors: Frederick A. Ware, Los Altos Hills, CA (US); Ely K. Tsern, Los Altos, CA (US); Ian P. Shaeffer, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 4 days.

(21) Appl. No.: 14/272,295

(22) Filed: May 7, 2014

(65) Prior Publication Data

US 2014/0329359 A1     Nov. 6, 2014

Related U.S. Application Data (63) Continuation of application No. 13/166,996, filed on Jun. 23, 2011, now Pat. No. 8,749,042, which is a
(Continued)

(51) Int. Cl.
*H01L 21/768* (2006.01)
*H01L 25/065* (2006.01)

(52) U.S. Cl.
CPC ........ *H01L 21/768* (2013.01); *H01L 25/0657* (2013.01); *H01L 2224/05568* (2013.01);
(Continued)

(58) Field of Classification Search
CPC ............... H01L 21/768; H01L 25/0657; H01L 2225/06513; H01L 2225/06527; H01L 2225/06541; H01L 25/074
See application file for complete search history.

(56) References Cited

U.S. PATENT DOCUMENTS

| 5,177,594 A | 1/1993 | Chance et al. |
| 5,258,648 A | 11/1993 | Lin |
(Continued)

FOREIGN PATENT DOCUMENTS

EP    0312217    4/1989

OTHER PUBLICATIONS

Ware, Frederick A., U.S. Appl. No. 11/402,393, filed Apr. 11, 2006, re Notice of Allowance and Fee(s) Due dated Nov. 17, 2009. 4 pages.
(Continued)

*Primary Examiner* — Kevin Parendo
(74) *Attorney, Agent, or Firm* — Morgan, Lewis & Bockius LLP (57) ABSTRACT

Multiple devices, including a first device and a second device, have operational circuitry and opposing first and second surfaces. First and second electrical contacts are formed at the first surface, while a third electrical contact is formed at the second surface opposite the first electrical contact. The first electrical contact is electrically connected to the operational circuitry, and the second electrical contact is electrically connected to the third electrical contact. The first device and the second device are subsequently stacked such that the first surface of the second device is located adjacent the second surface of the first device such that the first electrical contact of the second device is aligned with the third electrical contact of the first device. The first electrical contact of the second device is electrically connected to the third electrical contact of the first device.

9 Claims, 6 Drawing Sheets

Related U.S. Application Data continuation of application No. 12/361,513, filed on Jan. 28, 2009, now Pat. No. 7,989,265, which is a continuation of application No. 11/402,393, filed on Apr. 11, 2006, now Pat. No. 7,701,045.

(52) U.S. Cl.
CPC ............ *H01L 2224/05573* (2013.01); *H01L 2224/16145* (2013.01); *H01L 2225/06513* (2013.01); *H01L 2225/06527* (2013.01); *H01L 2225/06541* (2013.01); *H01L 2924/00014* (2013.01); *H01L 2924/10253* (2013.01)

(56) References Cited

U.S. PATENT DOCUMENTS

| | | | |
|---|---|---|---|
| 5,327,013 | A | 7/1994 | Moore et al. |
| 5,355,283 | A | 10/1994 | Marrs et al. |
| 5,517,515 | A | 5/1996 | Spall et al. |
| 5,703,400 | A | 12/1997 | Wojnarowski et al. |
| 5,717,245 | A | 2/1998 | Pedder |
| 5,770,477 | A | 6/1998 | Brandenburg |
| 5,840,417 | A | 11/1998 | Bolger |
| 5,854,534 | A | 12/1998 | Beilin et al. |
| 6,022,758 | A | 2/2000 | Badehi |
| 6,052,287 | A | 4/2000 | Palmer et al. |
| 6,144,090 | A * | 11/2000 | Higashiguchi ............... 257/693 |
| 6,177,296 | B1 | 1/2001 | Vindasius et al. |
| 6,221,753 | B1 | 4/2001 | Seyyedy |
| 6,271,587 | B1 | 8/2001 | Patti |
| 6,392,292 | B1 * | 5/2002 | Morishita ............. H01L 23/481 257/686 |
| 6,643,434 | B2 | 11/2003 | Cayrefourcq et al. |
| 6,706,546 | B2 | 3/2004 | Yoshimura et al. |
| 7,071,546 | B2 | 7/2006 | Fey et al. |
| 7,098,541 | B2 | 8/2006 | Adelmann |
| 7,208,343 | B2 | 4/2007 | Song et al. |
| 7,701,045 | B2 | 4/2010 | Ware et al. |
| 7,745,920 | B2 | 6/2010 | Lee et al. |
| 2002/0195697 | A1 * | 12/2002 | Mess .................. H01L 23/3128 257/686 |
| 2003/0052399 | A1 | 3/2003 | Shibata |
| 2003/0146012 | A1 | 8/2003 | Song et al. |
| 2003/0209791 | A1 | 11/2003 | Akram et al. |
| 2004/0089930 | A1 * | 5/2004 | Beroz .................... H01L 23/48 257/678 |
| 2004/0178495 | A1 | 9/2004 | Yean et al. |
| 2004/0245615 | A1 | 12/2004 | Cady et al. |
| 2005/0087438 | A1 | 4/2005 | Heston |
| 2005/0194674 | A1 | 9/2005 | Thomas et al. |
| 2007/0045807 | A1 | 3/2007 | Greenwood et al. |
| 2007/0045862 | A1 | 3/2007 | Corisis et al. |
| 2009/0130798 | A1 | 5/2009 | Ware et al. |

OTHER PUBLICATIONS

Ware, Frederick A., U.S. Appl. No. 11/402,393, filed Apr. 11, 2006, re Notice of Allowance and Fee(s) Due dated Oct. 30, 2008. 7 pages.
Ware, Frederick A., U.S. Appl. No. 11/402,393, filed Apr. 11, 2006, re Office Action dated Apr. 6, 2009. 14 pages.
Ware, Frederick A., U.S. Appl. No. 11/402,393, filed Apr. 11, 2006, re Office Action dated May 19, 2008. 28 pages.
Ware, Frederick A., U.S. Appl. No. 12/361,513, filed Jan. 28, 2009, re Response to Election/Restriction Requirement dated Jul. 15, 2010. 3 pages.
Ware, Frederick A., U.S. Appl. No. 12/361,513, filed Jan. 28, 2009, re Final Office Action dated Jan. 13, 2011. 19 pages.
Ware, Frederick A., U.S. Appl. No. 12/361,513, filed Jan. 28, 2009, re Non-Final Office Action dated Aug. 2, 2010. 22 pages.
Ware, Frederick A., U.S. Appl. No. 12/361,513, filed Jan. 28, 2009, re Notice of Allowance and Fee(s) Due dated Mar. 28, 2011. 10 pages.
Ware, Frederick A., U.S. Appl. No. 12/361,513, filed Jan. 28, 2009, re Office Action dated Jan. 13, 2011. 19 pages.
Ware, Frederick A., U.S. Appl. No. 12/361,513, filed Jan. 28, 2009, re Response dated Mar. 14, 2011. 18 pages.
Ware, Frederick A., U.S. Appl. No. 12/361,513, filed Jan. 28, 2009, re Office Action dated Jun. 16, 2010 re restriction and/or election requirement. 6 pages.
Ware, Frederick A., U.S. Appl. No. 12/361,513, filed Jan. 28, 2009, re Response dated Nov. 2, 2010. 14 pages.
Ware, Frederick A., U.S. Appl. No. 13/166,996, filed Jun. 23, 2011, re Final Office Action dated May 11, 2012. 10 pages.
Ware, Frederick A., U.S. Appl. No. 13/166,996, filed Jun. 23, 2011, re Office Action dated Jan. 25, 2012. 12 pages.
Ware, Frederick A., U.S. Appl. No. 13/166,996, filed Jun. 23, 2011, re Office Action dated Dec. 12, 2011. 6 pages.
Ware, Frederick A., U.S. Appl. No. 13/166,996, filed Jun. 23, 2011, re Response dated Jan. 6, 2012. 2 pages.
Ware, Frederick A., U.S. Appl. No. 13/166,996, filed Jun. 23, 2011, re Response dated Apr. 19, 2012. 15 pages.

\* cited by examiner

METHOD OF MAKING A STACKED DEVICE ASSEMBLY

This application is a continuation application of U.S. patent application Ser. No. 13/166,996, filed on Jun. 23, 2011, titled "Process for Making a Semiconductor System" which is a continuation application of U.S. patent application Ser. No. 12/361,513, filed on Jan. 28, 2009, titled "Process for Making a Semiconductor System" now U.S. Pat. No. 7,989,265, which is a continuation application of U.S. patent application Ser. No. 11/402,393, filed on Apr. 11, 2006, titled "Point-To-Point Connection Topology For Stacked Devices," now U.S. Pat. No. 7,701,045, the entire contents of these applications are incorporated herein by reference.

TECHNICAL FIELD

The embodiments disclosed herein relate to semiconductor devices, and in particular to point-to-point interconnection systems for stacked devices.

BACKGROUND

As computer systems evolve, so does the demand for increased memory for such systems. To increase memory density, some memory modules stack integrated circuit (IC) dies one on top of the other. While memory subsystems commonly use die-stacking, System-in-Package (SIP) systems may also include stacked IC processor and controller die. These stacked systems permit high IC densities, thereby increasing the memory capacity of each module without requiring additional space on the underlying circuit board. Die stacking, however, does present a number of drawbacks, as described below.

In these stacked systems, the bare silicon die are typically given an overcoat of oxide to protect the die during handling. A redistribution layer (RDL) of metal may then be deposited on top of this oxide to form an external interconnection system. Holes or contacts are then etched in the oxide so the RDL metal can connect to the internal metal layers of the silicon die. When the silicon die are assembled into a vertical stack, the RDLs allow signals to pass through the stack.

Such RDLs may be appropriate for bussed (multi-drop) connections, where all of the silicon die in a stack are coupled to the same bus. However, such RDL systems are not well suited to point-to-point connections, where separate connections need to be made to individual die in the stack. This is because point-to-point connections typically require complex and custom RDLs on each die to properly route the signals through the stack. These custom RDLs on each silicon die are complex and costly to design and manufacture, particularly in the case in which all the silicon die are the same (e.g., memory die). Accordingly, a system that eliminates custom RDLs in a stacked system would be highly desirable.

BRIEF DESCRIPTION OF THE DRAWINGS

For a better understanding of the disclosure herein, reference should be made to the following detailed description taken in conjunction with the accompanying drawings, in which.

Like reference numerals refer to the same or similar components throughout the several views of the drawings.

DETAILED DESCRIPTION OF THE EMBODIMENTS

The following description describes various point-to-point interconnection systems. Point-to-point interconnect topology may be required for a number of reasons, such as (i) the die stack may connect to signals that are used by only one of the silicon die (e.g., a chip-select signal in the case of a memory die), (ii) point-to-point interconnect topology permits higher signaling rates than multi-drop topology, and/or (iii) point-to-point topology has fewer resource contention issues than a multi-drop topology (i.e., read-write turnaround and tri-state enable/disable delays).

In some embodiments, a point-to-point interconnection system includes a device having opposing first and second surfaces. The device includes operational circuitry, first, second and third electrical contacts, and a conductor. The first electrical contact is mechanically coupled to the first surface and electrically coupled to the operational circuitry. The second electrical contact is mechanically coupled to the first surface, while the third electrical contact is mechanically coupled to the second surface opposite, and aligned with, the first electrical contact. The conductor electrically couples the second electrical contact to the third electrical contact. The device may be an integrated circuit die or an integrated circuit package containing at least one die.

In other embodiments, a stacked device assembly includes a plurality of substantially identical devices stacked one on top of the other. Each device has a first surface and an opposing second surface, and includes operational circuitry, a first row of electrical contacts, a second row of electrical contacts, and a plurality of conductors. The first row of electrical contacts is arranged on the first surface such that each electrical contact is separated from an adjacent electrical contact by a predetermined distance. A first electrical contact of the first row of electrical contacts is electrically coupled to the operational circuitry. The second row of electrical contacts is arranged on the second surface, where each electrical contact is separated from an adjacent electrical contact by the predetermined distance. The second row is offset from the first row along the second surface by the predetermined distance. Each of the plurality of conductors is electrically coupled to a respective electrical contact in the first and second row.

In yet other embodiments, a stacked device assembly includes first and second devices each having a first surface and an opposing second surface. Each device includes operational circuitry, a first electrical contact, a second electrical contact, a third electrical contact, and a conductor. The first electrical contact is mechanically coupled to the first surface and electrically coupled to the operational circuitry. The second electrical contact is mechanically coupled to the first surface. The third electrical contact is mechanically coupled to the second surface opposite, and aligned with, the first electrical contact. The conductor electrically couples the second electrical contact to the third electrical contact. The second device is stacked adjacent the first device with the first surface of the second device located adjacent the second surface of the first device. The first electrical contact of the second device is aligned with and is electrically coupled to the third electrical contact of the first device.

Figure 1A:
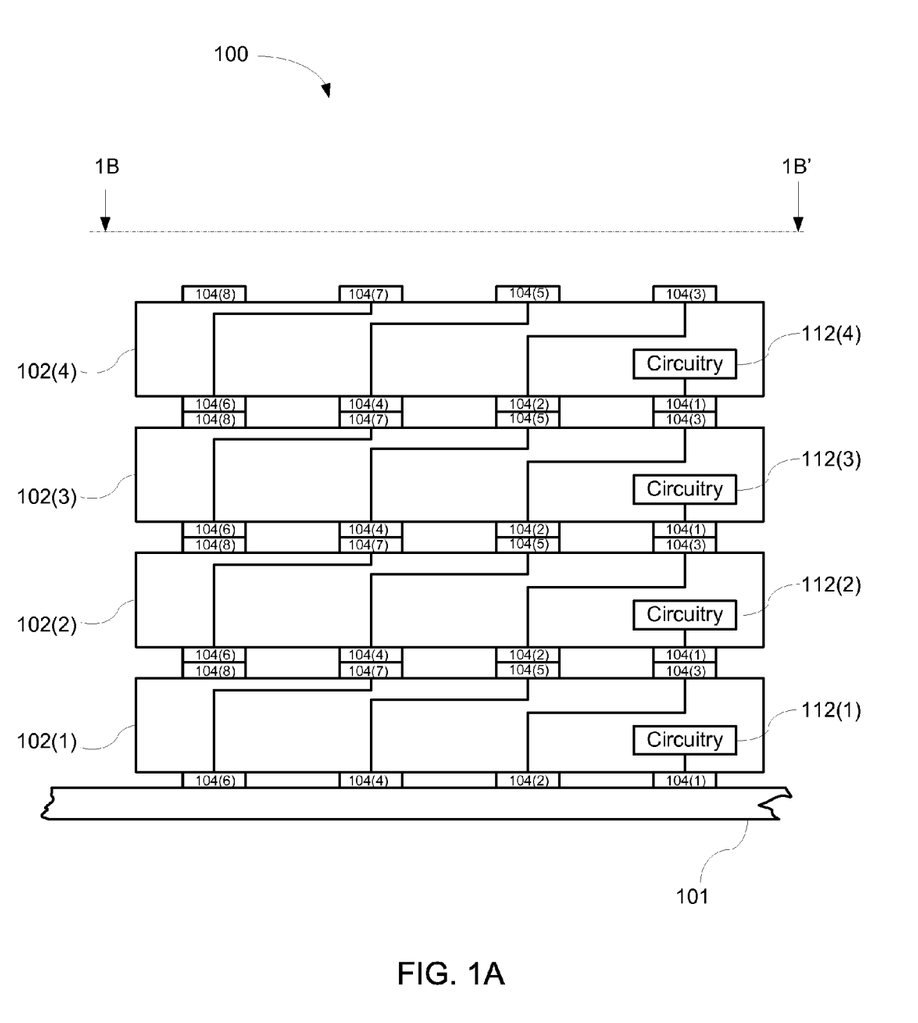
FIG. 1A is a schematic cross-sectional side view of a point-to-point interconnection system for stacked devices, according to an embodiment.
Figure 1B:
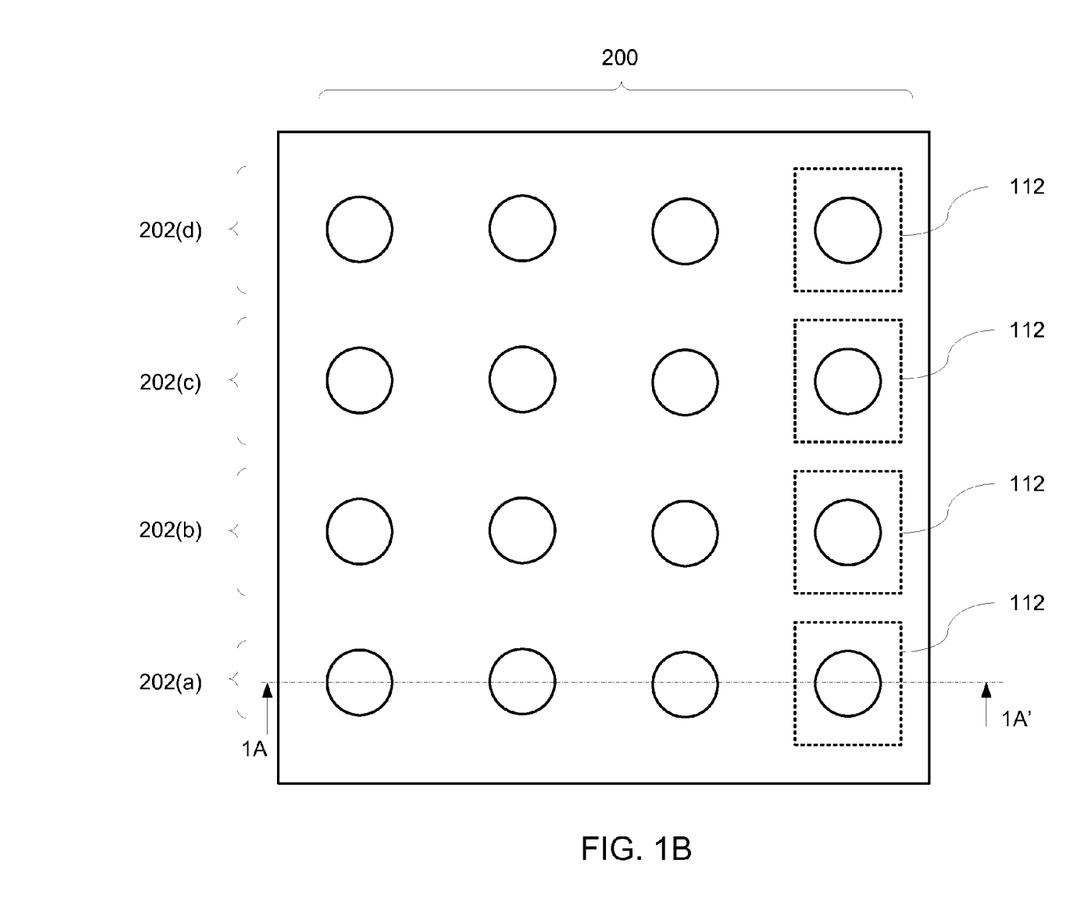
FIG. 1B is a schematic plan view of the system shown in FIG. 1A, as viewed along line 1B-1B' of FIG. 1A.

FIG. 1A is a schematic cross-sectional side view of a point-to-point interconnection system 100 for stacked devices (as viewed along line 1A-1A' of FIG. 1B). As shown, multiple devices 102(1)-102(4) are stacked one on top of the other. The devices may be stacked symmetrically above one another, as shown, or they may be offset from one another, i.e., arranged in a stair-like manner. In some embodiments, each of the multiple devices 102(1)-102(4) are identical. In some embodiments, each of the multiple devices 102(1)-102(4) may have different operational circuitry, but may still have electrical contacts 104 located at the identical positions, e.g., may have identical RDLs. In use, the stack of multiple devices 102(1)-102(4) is mechanically and electrically coupled to a substrate 101, such as a motherboard.

In some embodiments, each of the multiple devices 102(1)-102(4) is an integrated circuit or die. In other embodiments, each of the multiple devices 102(1)-102(4) is a separate integrated circuit package containing at least one integrated circuit or die. In yet other embodiments, each device is a module containing one or more dies or packages. The devices in the stack may also be any combination of the aforesaid devices. For example, each of the multiple devices 102(1)-102(4) may be a single die or a package containing multiple die, such as a memory module or a System-in-Package (SIP). As will be described in further detail below, one of the advantages of the point-to-point interconnection system 100 is that it facilitates point-to-point connections to any of the devices in a stack without requiring a custom RDL for each device, as all of the devices are either identical or the layout of their electrical contacts are identical.

Figure 2:
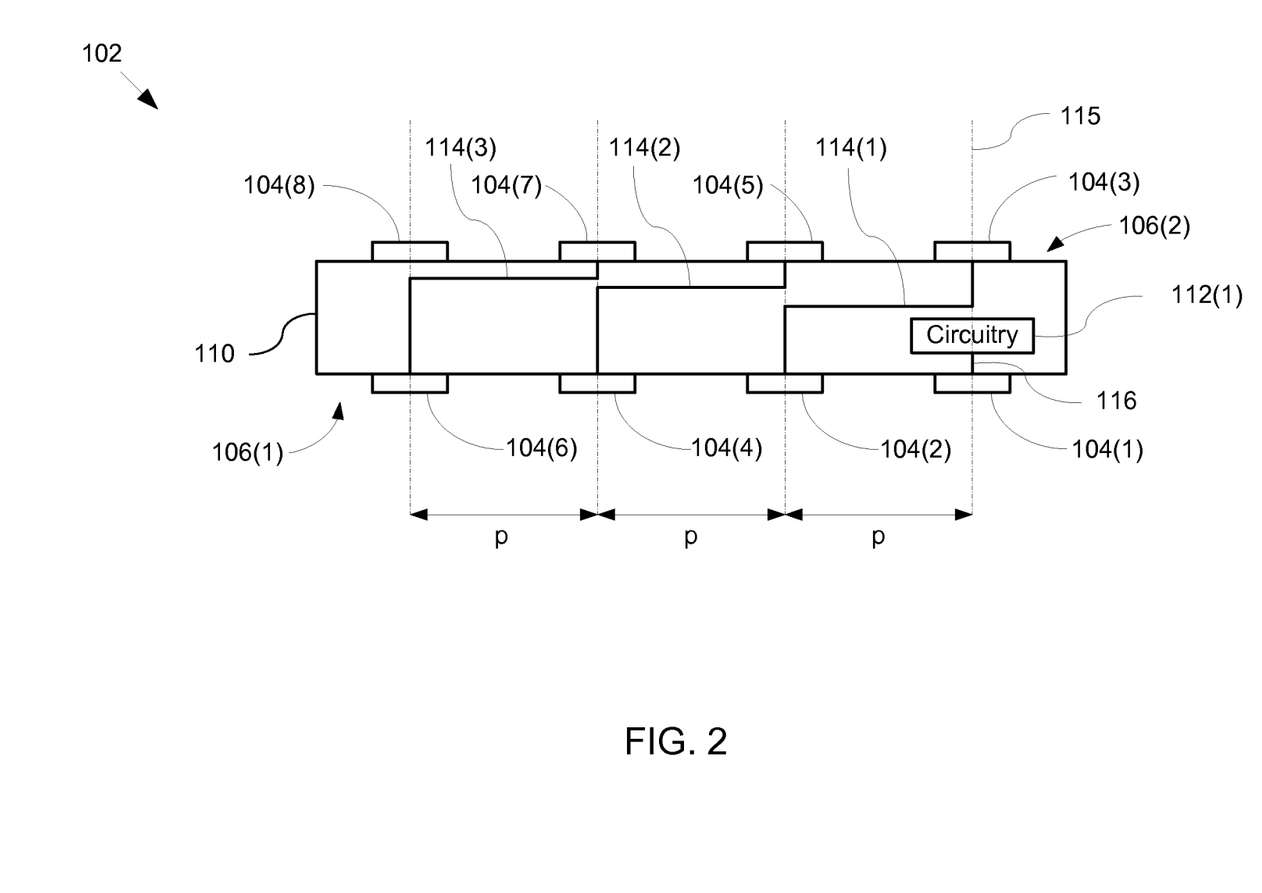
FIG. 2 is a schematic cross-sectional side view of one of the devices shown in FIGS. 1A and 1B.

FIG. 2 is a schematic cross-sectional side view of one of the devices 102 shown in FIGS. 1A and 1B. The device 102 includes a substrate 110, operational circuitry 112, multiple electrical contacts or connectors 104 and multiple conductors 114 and 116. In the embodiments where the device is an integrated circuit, the substrate 110 may be a silicon substrate. In the embodiment where the device is a package or module containing multiple integrated circuits, the substrate 110 may be a printed circuit board (PCB), ceramic substrate, or the like. The device 102 has opposing first and second sides 106(1) and 106(2), respectively. In some embodiments, the substrate 110 is substantially planar, i.e., has substantially flat opposing first and second surfaces.

Figure 4A:
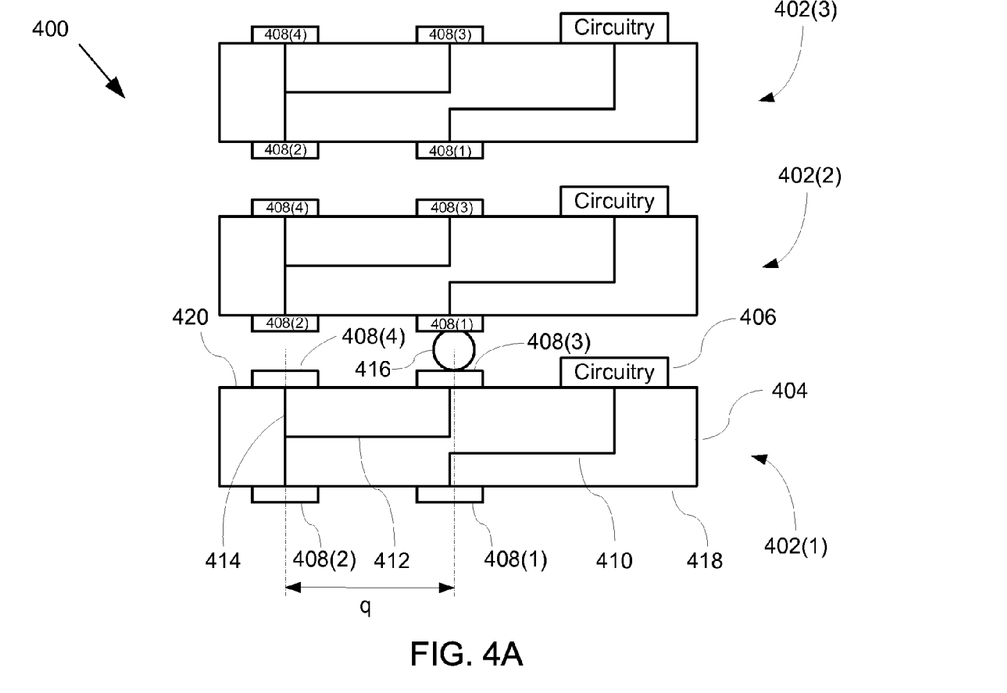
FIG. 4A is a schematic cross-sectional side view of yet another point-to-point interconnection system for stacked devices, as viewed along line 4A-4A' of FIG. 4C, according to yet another embodiment.
Figure 4B:
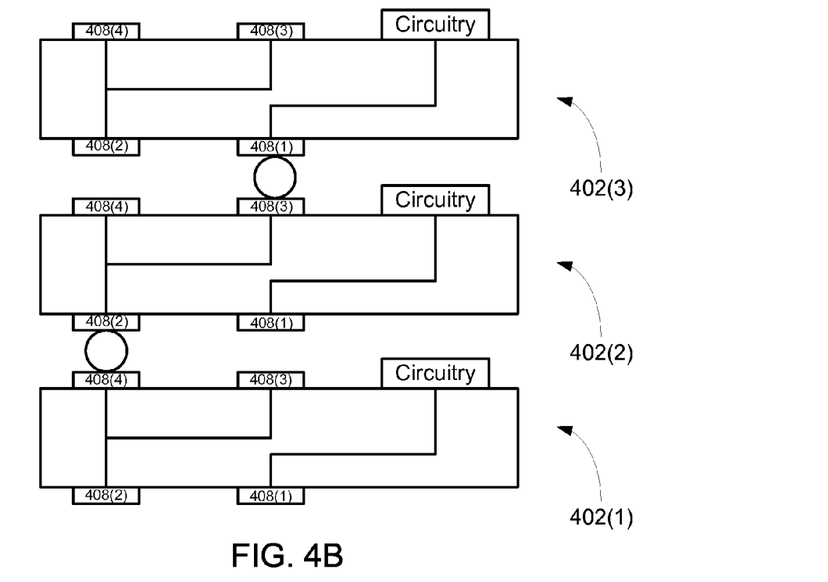
FIG. 4B is a schematic cross-sectional side view of the point-to-point interconnection system of FIG. 4A, as viewed along line 4B-4B' of FIG. 4C.

The operational circuitry 112 may be embedded into, or internal to, the substrate 110, as shown, or mounted on the substrate 110, as shown in FIGS. 4A and 4B. In the embodiments where the device is an integrated circuit, the operational circuitry may include one or more transistors embedded into the die. In the embodiment where the device is a package or module containing multiple integrated circuits, the operational circuitry 112 may be an integrated circuit or die. In some embodiments, multiple discrete operational circuitry components 112 are provided per device, as shown in FIG. 1B.

In some embodiments, the multiple electrical contacts 104 include at least three electrical contacts 104(1), 104(2), and 104(3). In other embodiments, the device may include as many electrical contacts 104 as is required. Some embodiments include an array 200 of multiple rows 202(a)-202(d) of electrical contacts 104, as shown in FIG. 1B. The electrical contacts may take on any form such as metallic bumps or pads formed or etched onto the surface or RDL of the device 102. In some embodiments, each electrical contact 104 in a row 202 (FIG. 1B) on each side of the device is separated from an adjacent electrical contact in that row by the same predetermined pitch (p) (FIG. 2). Also in some embodiments, each electrical contact on the second surface 106(2) of the device is aligned with a respective electrical contact on the first surface 106(1) of the device, along an imaginary line 115 perpendicular to the surface of the device or parallel to the stacked direction. For example, electrical contact 104(3) is aligned (e.g., collinear) with electrical contact 104(1) along an imaginary line 115 that is perpendicular to the first and second surfaces 106(1) and 106(2), respectively; and electrical contact 104(1) is separated from electrical contact 104(2) by a pitch (p). In other words, in some embodiments, the electrical contact 104(3) is arranged opposite the electrical contact 104(1); the electrical contact 104(5) is arranged opposite the electrical contact 104(2); etc.

In some embodiments of the invention, the first electrical contact 104(1), which is mechanically coupled to the first surface 106(1) of the device, is electrically coupled to the operational circuitry 112 via an operational circuitry electrical conductor 116. The second electrical contact 104(2), which is mechanically coupled to the first surface 106(1) of the device, is electrically coupled to the third electrical contact 104(3), which is mechanically coupled to the second surface 106(2) of the device, via a first electrical conductor 114(1). The electrical conductors may be any suitable electrical conductors that electrically and/or mechanically couple components together, such as wires, redistribution layers, vias, any combination of the aforementioned, or the like.

In other embodiments of the invention, other electrical contacts are electrically coupled to one another via different electrical conductors. For example, a fourth electrical contact 104(4), which is mechanically coupled to the first surface 106(1) of the device, is electrically coupled to a fifth electrical contact 104(5), which is mechanically coupled to the second surface 106(2) of the device, via a second electrical conductor 114(2). Similarly, a sixth electrical contact 104(4), which is mechanically coupled to the first surface 106(1) of the device 102, may be electrically coupled to a seventh electrical contact 104(5), which is mechanically coupled to the second surface 106(2) of the device, via a second electrical conductor 114(3). It should be appreciated that any number of electrical contacts may be provided.

Referring to FIGS. 1A, 1B and 2, in use, a signal to be routed to the operational circuitry 112(1) of the first device 102(1) is communicated to the first electrical contact 104(1) of the first device 102(1); and communicated from the first electrical contact 104(1) to the operational circuitry 112(1) of the device 102(1) via the operational circuitry conductor 116 of the first device 102(1). However, to route a signal to the operational circuitry 112(2) of the second device 102(2) in the stack, the signal is communicated to the electrical contact 104(2) of the first device 102(1); communicated through the first conductor 114(1) to the third electrical contact 104(3) of the first device 102(1); communicated from the third electrical contact 104(3) of the first device 102(1) to the first electrical contact 104(1) of the second device 102(2); and communicated from the first electrical contact 104(1) of the second device 102(2) to the operational circuitry 112(2) of the second device 102(2) via the operational circuitry conductor 116 of the second device 102(2). In a similar manner, a signal to be routed to the operational circuitry 112(3) of the third device 102(3) is communicated to the fourth electrical contact 104(4) of the first device 102(1) and is routed through the first and second devices to the third device; and a signal to be routed to the operational circuitry 112(4) of the fourth device 102(4) is communicated to the sixth electrical contact 104(6) of the first device 102(1) and is routed through the first, second and third devices to the fourth device. Accordingly, the identical (or substantially similar) layout of electrical contacts and interconnecting conductors on the devices allows point-to-point connections to be made to all of the devices in the stack without requiring a customized RDL for one or more of the devices.

Figure 3:
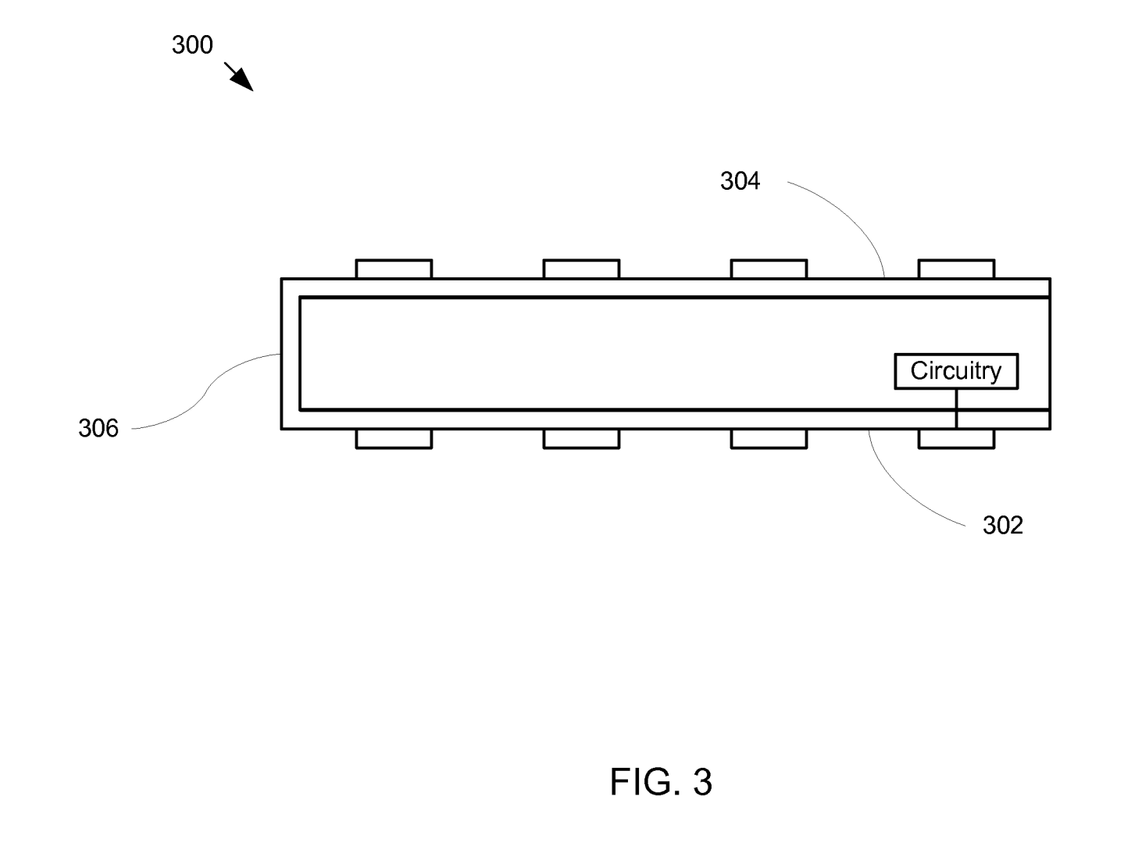
FIG. 3 is a schematic cross-sectional side view of another device that may be used in the point-to-point interconnection system shown in FIGS. 1A and 1B, according to another embodiment.

FIG. 3 is a schematic cross-sectional side view of another point-to-point interconnection system 300 for stacked devices. In this embodiment, a RDL is created that wraps around at least one edge of the device to route signals between corresponding electrical contacts. As shown, the RDL may include a first RDL 302 on the first surface of the device, a second RDL 304 on the second surface of the device, and a third RDL 306 at an edge of the device that couples the first RDL 302 to the second RDL 304. It should, however, be appreciated that corresponding electrical contacts may be electrically coupled by any suitable means, such as by a different RDL to that described above, by vias through the device, a combination of RDLS and vias, etc. For example, the RDL may consist of any metal applied to the top and bottom (or front and back) of the silicon die, or it may alternatively consist of holes (vias) etched from the top surface to the bottom surface (or back surface to the front surface), with metal deposited in the holes. In an alternative embodiment, a flexible tape is used as a RDL substitute.

FIG. 4A is a schematic cross-sectional side view of yet another point-to-point interconnection system 400 for stacked devices. In this embodiment, three devices 402 are stacked on top of one another. In some embodiments, each of the multiple devices 402 are identical. In other embodiments, each of the multiple devices 402 have different operational circuitry, but still have identically located electrical contacts 408. In use, the stack of multiple devices is mechanically and electrically coupled to a substrate, such as a motherboard (not shown).

Each device 402 includes a substrate 404, operational circuitry 406, multiple electrical contacts or connectors 408 and multiple conductors 410, 412, and 414. In the embodiments where the device 402 is an integrated circuit, the substrate 404 may include a silicon substrate. In the embodiments where the device is a package or module containing multiple integrated circuits, the substrate 404 may be a printed circuit board (PCB) or the like. The device 402 has opposing first and second sides 418 and 420, respectively. In some embodiments, the substrate 404 is substantially planar, i.e., has substantially flat opposing first and second sides.

The operational circuitry 406 may be embedded into the substrate 404 or mounted on the substrate 404, as shown. In the embodiments where the device is an integrated circuit, the operational circuitry may include one or more transistors embedded into the die. In the embodiment where the device is a package or module containing multiple integrated circuits, the operational circuitry may be an integrated circuit or die. In some embodiments, multiple discrete operational circuitry components are provided.

Figure 4C:
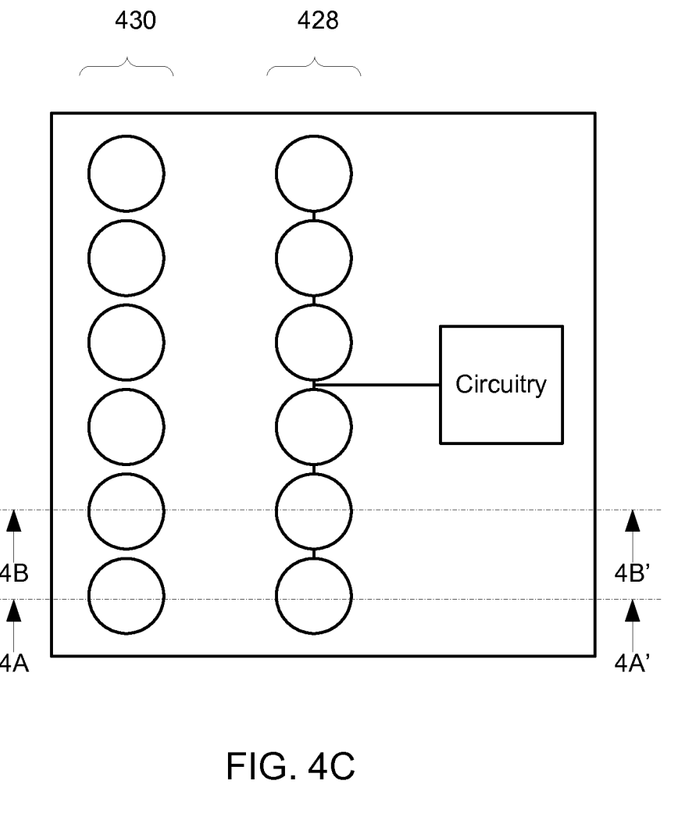
FIG. 4C is a schematic plan view of the systems shown in FIGS. 4A and 4B.

In some embodiments, the multiple electrical contacts 408 include at least four electrical contacts 408(1), 408(2), 408(3), and 408(4). In other embodiments, the device may include as many electrical contacts as is required. Some embodiments include an array of multiple rows 428 and 430 of electrical contacts 408, as shown in FIG. 4C. The electrical contacts may take on any form such as metallic bumps or pads formed or etched onto the surface of the device 402. In some embodiments, electrical contacts 408(1) and 408(2) are separated from one another by a predetermined pitch (q). Similarly, electrical contacts 408(3) and 408(4) are separated from one another by a predetermined pitch (q). Also in some embodiments, each electrical contact on the second surface 420 of the device is aligned with a respective electrical contact on the first surface 418 of the device. For example, electrical contact 408(3) is aligned or collinear with electrical contact 408(1) along an imaginary line that is perpendicular to the first and second surfaces; electrical contact 408(4) is aligned (e.g., collinear) with electrical contact 408(2) along an imaginary line that is perpendicular to the first and second surfaces; electrical contact 408(1) is separated from electrical contact 408(2) by a pitch q; and contact 408(3) is separated from electrical contact 408(4) by the pitch q.

In some embodiments of the invention, the first electrical contact 408(1) is electrically coupled to the operational circuitry 406 via an operational circuitry electrical conductor 410. The second electrical contact 408(2) is electrically coupled to the third electrical contact 408(3), which is mechanically coupled to the second surface 420 of the device 402, via a first electrical conductor 412. The second electrical contact 408(2) is also electrically coupled to the fourth electrical contact 408(4), which is mechanically coupled to the second surface 420 of the device 402, via a second electrical conductor 414. The electrical conductors may be any suitable electrical conductors, such as wires, redistribution layers, vias, or the like. In other embodiments of the invention, additional electrical contacts may be electrically coupled to one another via additional electrical conductors that are similar to those described above.

As shown in FIG. 4A, when the two devices 402(1) and 402(2) are arranged in a stack, an electrical connection is either formed between the third electrical contact 408(3) of the first device 402(1) and the first electrical contact 408(1) of the second device 402(2), or between the fourth electrical contact 408(4) of the first device 402(1) and the second electrical contact 408(2) of the second device 402(2). This electrical connection may be formed by a solder bead 416 or the like. As shown in FIG. 4A, an electrical connection is formed between the third electrical contact 408(3) of the first device 402(1) and the first electrical contact 408(1) of the second device 402(2). Accordingly, in use, a signal to be routed to the operational circuitry 406 of the first device 402(1) is communicated to the first electrical contact 408(1) of the first device 402(1); and communicated from the first electrical contact 408(1) to the operational circuitry 406 of the device 402(1) via the operational circuitry conductor 410 of the first device 402(1). However, to route a signal to the operational circuitry 406 of the second device 402(2) in the stack, the signal is communicated to the electrical contact 408(2) of the first device 402(1); communicated through the first conductor 412 to the third electrical contact of the first device 402(1); communicated from the third electrical contact of the first device 402(1) to the first electrical contact 408(1) of the second device 402(2); and communicated from the first electrical contact 408(1) of the second device 402(2) to the operational circuitry 406 of the second device 402(2) via the operational circuitry conductor 410 of the second device 402(2).

Similarly, FIG. 4B shows a schematic cross-sectional side view of the point-to-point interconnection system of FIGS. 4A and 4C, as viewed along line 4B-4B' of FIG. 4C. Here an electrical connection is made between the fourth electrical contact of the first device 402(1) and the second electrical contact of the second device 402(2); and between the third electrical contact of the second device 402(2) and the first electrical contact 408(1) of the third device 402(3). A signal routed to the first electrical contact of the first device 402(1) is routed to the operational circuitry 406 of the first device, while a signal routed to the second electrical contact of the first device 402(1) is routed to the operational circuitry of the third device 402(3). Accordingly, by placing electrical connections between predetermined electrical contacts, signals can be communicated through the device along conductors 412, 414 or routed to the operational circuitry of the device. Accordingly, the identical (or substantially similar) layout of electrical contacts and interconnecting conductors on the devices allows point-to-point connections to be made to all of the devices in the stack without requiring a customized RDL for one or more of the devices.

The above described systems allow signals to be passed through the stack from one device to the next. In some embodiments, each signal is also shifted one position laterally (in a direction perpendicular to the primary vertical direction of the stack). This permits a signal to be fed into the vertical stack at the bottom device, and be received at a device higher in the stack. This is facilitated by designing the identical pattern of electrical contacts (or RDLs) for all devices in the stack. The above mentioned embodiments permit a unique point-to-point signal (like a chip select for a memory die) to be driven to each device.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. The presently disclosed embodiments are therefore to be considered in all respects as illustrative and not restrictive, the scope of the invention being indicated by the appended claims, and not limited to the foregoing description.

What is claimed is:

1. A process for making a stacked device assembly having a plurality of devices each with opposing first and second surfaces and operational circuitry mounted on the second surface, the process comprising:
for each of the plurality of devices:
forming a first electrical contact and a second electrical contact at the first surface of the respective device;
forming a third electrical contact at the second surface of the respective device, wherein the third electrical contact is located opposite to the first electrical contact;
forming a fourth electrical contact on the second surface of the respective device, wherein the fourth electrical contact is located opposite to the second electrical contact;
electrically connecting the first electrical contact to the operational circuitry, wherein, other than the operational circuitry being mounted on the second surface of the respective device, the operational circuitry and the first electrical contact are not electrically connected to any additional electrical contacts at the first and second surfaces of the same respective device;
electrically connecting the second electrical contact at the first surface to the third electrical contact at the second surface; and
electrically connecting the fourth electrical contact at the second surface to the second electrical contact at the first surface.

2. The process of claim 1, wherein the plurality of devices include a first device and a second device that are identical to each other, the process further comprising:
stacking the first device and the second device such that the first surface of the second device is located adjacent to the second surface of the first device, where the first electrical contact of the second device is aligned with the third electrical contact of the first device; and
aligning and electrically connecting the first electrical contact of the second device to the third electrical contact of the first device.

3. The process of claim 2, wherein after stacking the first device and the second device, the operational circuitry of the second device is electrically coupled to the second electrical contact of the first device.

4. The process of claim 1, wherein the plurality of devices includes a first device, a second device, and a third device that are identical to each other, the process further comprising:
stacking the second device and the first device such that the first surface of the second device is located adjacent to the second surface of the first device;
stacking the third device and the second device such that the first surface of the third device is located adjacent to the second surface of the second device;
aligning and electrically connecting the first electrical contact of the third device to the third electrical contact of the second device for electrically coupling the operational circuitry on the second surface of the third device to the second electrical contact of the second device; and
aligning and electrically connecting the second electrical contact of the second device to the fourth electrical contact of the first device for electrically coupling the operational circuitry on the second surface of the third device to the second electrical contact of the first device.

5. The process of claim 1, wherein each of the devices is selected from a group consisting of: an integrated circuit die, an integrated circuit package containing at least one die, a memory module containing at least one die, and an integrated circuit package containing multiple integrated circuit die, where the operational circuitry is associated with a die in the respective device.

6. The process of claim 1, wherein, for each of the devices, electrically connecting the second electrical contact to the third electrical contact of the device comprises forming a redistribution layer that wraps around an edge of the respective device.

7. The process of claim 1, wherein the plurality of devices have identical layout of electrical contacts, and at least two of the plurality of devices have different operational circuitry.

8. The process of claim 1, wherein, for each of the devices, the second electrical contact is electrically connected to: (i) the third electrical contact and (ii) the fourth electrical contact of the respective device using a conductor.

9. The process of claim 8, wherein, for each of the devices, the first electrical contact is electrically connected to the operational circuitry of the respective device using a different conductor.

* * * * *